United States Patent [19]

Hunt

[11] 4,450,208

[45] May 22, 1984

[54] COMPOSITE ARTICLE FOR A SEMICONDUCTOR DEVICE

[75] Inventor: Joseph M. Hunt, Natrona Heights, Pa.

[73] Assignee: Allegheny Ludlum Steel Corporation, Pittsburgh, Pa.

[21] Appl. No.: 431,506

[22] Filed: Sep. 30, 1982

[51] Int. Cl.³ .............................................. H01L 29/00
[52] U.S. Cl. ................................... 428/620; 148/6.16; 148/174
[58] Field of Search .................. 428/620; 148/6.16

[56] References Cited

U.S. PATENT DOCUMENTS 3,703,419 11/1972 Esler .................................. 148/6.16
3,961,997 6/1976 Chu ...................................... 148/174
4,273,594 6/1981 Heller et al. ........................ 428/620

OTHER PUBLICATIONS

T. L. Chu, J. Vac. Sci. Technol. vol. 12, No. 4, Jul.-/Aug. 1975, pp. 912–915.
T. L. Chu et al., J. Electrochem. Soc. 122(12) Dec. 1975, pp. 1681–1685.

Primary Examiner—Veronica O'Keefe
Attorney, Agent, or Firm—Patrick J. Viccaro

[57] ABSTRACT

A composite article, and method for producing the same, said article being adapted for use as a semiconductor device. The composite article comprises and is produced by depositing on a first layer of metal having an irregular metal surface a second layer consisting essentially of a phosphate, silicate or a combination thereof, said second layer having a thickness sufficient to provide a smooth surface over said irregular metal surface and a third layer of a conventional semiconductor material coated on said smooth surface.

4 Claims, No Drawings

COMPOSITE ARTICLE FOR A SEMICONDUCTOR DEVICE

BACKGROUND OF THE INVENTION

This invention relates to a composite article and method of producing composite articles as semiconductor devices, such as photovoltaic cells. More particularly, this invention relates to providing a composite article having improved efficiency.

Composite articles, which are used as semiconductor devices such as for photovoltaic cells, comprise a metal layer, such as stainless steel, having a semiconductor material coated thereon to provide a thin surface layer. Conventional semiconductor material suitable for the purpose are amorphous silicon, gallium arsenide, cadmium sulfide and indium sulfide.

With composite articles of this type wherein an alloy such as stainless steel is used as the substrate, the surface to be coated is typically characterized by surface irregularities. These irregularities or imperfections on the surface are caused by phenomenon such as grain boundary etching during pickling, roll marks transferred from the workrolls used during cold rolling and foreign material that may be embedded in the metal surface during rolling or other operations.

It has been found that these surface irregularities in constructing a semiconductor device by coating on said surfaces a conventional semiconductor material can cause poor performance in applications such as photovoltaic cells and the like, particularly from the standpoint of "shorting" in the film surface that reduces conversion efficiency or renders the cell inoperable.

In semiconductor devices, such as photovoltaic cells, for example, raised or projecting surface irregularities of the metal substrate may not be coated by the semiconductor material and may extend through a coating of semiconductor material. Though such irregularities are extremely small, they can cause localized "shorting" or other electrical discontinuities when the irregularities extend through additional layers of intermediate insulative material and semiconductor materials. Such localized "shorting" results in overall losses in conversion efficiency, and in severe cases may result in inoperable devices. Similarly, "shorting" can be caused by substrate surface irregularities which are impressions, pockets or recesses which may result in discontinuities and/or undesired contact of the semiconductor layer. Generally, any contact between two or more semiconductor material layers can result in a "shorting" of the electrical circuit of the composite article semiconductor device.

It is, accordingly, a primary object of the present invention to provide a composite article for semiconductor applications wherein the layer of semiconductor material is deposited over a smooth surface to thereby improve the performance of the composite article in semiconductor applications.

SUMMARY OF THE INVENTION

In accordance with the present invention, a composite article is provided having an irregular metal surface, a second layer consisting essentially of a phosphate, silicate or a combination thereof on the irregular metal surface, and a third layer of a semiconductor material on a smooth surface provided by the second layer having a sufficient thickness to provide the smooth surface over the irregular metal surface.

A method of producing the compsite article is also provided.

DETAILED DESCRIPTION OF THE PREFERRED EMBODIMENTS

Broadly, in the practice of the invention the composite artice thereof comprises a first layer of metal, which may be stainless steel, and having thereon a typical irregular metal surface. Over the irregular metal surface is deposited a second layer consisting essentially of a phosphate, silicate, or a combination thereof. This second layer is of a thickness sufficient to cover the surface irregularities on the metal surface and thus provide a smooth surface over which a third layer of a conventional semiconductor material is applied. Each of the second and third layers may be applied by dip coating or spraying. The thickness of the second layer should be sufficient to cover any surface irregularities on the metal and for this purpose will vary typically within the thickness range of 0.000001 to 0.0001 inch (0.0000254–0.00254 mm). The semiconductor material may be amorphous silicon, gallium arsenide, cadmium sulfide and indium sulfide which are well known for the purpose.

The smooth surface provided by the layer of phosphate, silicate or a combination thereof has the additional advantage of providing a surface that is easily cleaned by conventional solvents and cleaning compounds. Suitable coatings of phosphate, silicate combinations and compounds are disclosed in U.S. Pat. No. 3,703,419, issued Nov. 21, 1972. As the surface to be cleaned is smooth and free of irregularities, there is minimum retention of foreign material and cleaning compound residue. Such cleanliness contributes to the quality of the composite article after coating with the semiconductor material.

As a typical example, composite articles of the present invention can be prepared as follows:

A metal substrate, such as T-304 stainless steel, can be prepared in accordance with conventional practices for providing a smooth surface of the sheet. Such practices may include bright annealing or hard cold rolled finishing with polished rolls. Generally, the substrate can be on the order of 0.005 to 0.050-inch (0.0127 to 0.127 cm) thick. A layer of coating can be applied to the substrate by any conventional reverse roller coating technique, spraying or dipping to provide a smooth surface. A suitable "phosphosilicate" coating of a phosphate and silicate combination can be made in accordance with U.S. Pat. No. 3,703,419. Such a coating may have the following as a composition:

| 915 ml $H_2O$ 70 gm MgO 78 ml $NH_4OH$ 130 gm $CrO_3$ 470 ml $H_3PO_4$ (85%) 11 ml 2% Duponol* C | Mixed with | 82 ml Kasil** #1 1392 ml $H_2O$ |
|---|---|---|

*Trade name of du Pont for a sodium lauryl sulfate compound.
**Trade name of Philadelphia Quartz Co. for a potassium silicate compound.

The coating can provide a smooth surface devoid of abrupt surface irregularities and imperfections as a result of covering any projecting irregularities and filling in and bridging any recessed irregularities of the first layer metal substrate.

A third layer of the composite article is a first coating of a semiconductor material which can be sprayed, vapor deposited or otherwise deposited onto the "phosphosilicate" layer. Subsequent layers of insulative material and semiconductor material can be applied alternately by conventional means to provide the desired composite article semiconductor device.

Prior to applying the semiconductor material onto the smoothing "phosphosilicate" layer, it may be necessary to remove, such as by etching with hydrochloric acid, some portions of the phosphosilicate layer to form a grid shape. The grid can then be filled in with a highly conductive metal, such as aluminum, copper, or even gold or silver, and provided with electrical conducts to complete the electrical circuit between the metal substrate and the layers of semiconductor on the phosphosilicate layer.

Another and more preferred embodiment would be to incorporate the grid circuit in the layer of semiconductor material. The grid circuit can be electrically connected to the metal substrate and other semiconductor layers at the edges of the metal substrate.

What is claimed is:

1. A composite article comprising a first layer of metal having an irregular stainless steel metal surface, a second layer consisting essentially of a phosphate, silicate or a combination thereof on said irregular metal surface, said second layer having a thickness sufficient to provide a smooth surface over said irregular metal surface and having a thickness of 0.000001 to 0.0001 inch after curing, and applied by a method selected from the group consisting of reverse roller coating, dipping and spraying, and a third layer of a semiconductor material on said smooth surface.

2. The composite article of claim 1 wherein said third layer is a semiconductor material selected from the group consisting of amorphous silicon, gallium arsenide, cadmium sulfide and indium sulfide.

3. A composite article of claim 1 wherein the semiconductor material third layer is in electrical contact with the metal first layer.

4. A composite article of claim 3 wherein a portion of the second layer is removed to provide electrical contact between the metal first layer and semiconductor material third layer.

* * * * *